United States Patent
Van Voorst Vader et al.

(10) Patent No.: US 6,413,081 B2
(45) Date of Patent: Jul. 2, 2002

(54) METHOD FOR PURGING A FURNACE AND FURNACE ASSEMBLY

(76) Inventors: Pieter Johannes Quintus Van Voorst Vader, Jacob Marissstraat 13, NL-5691 DL Son; Jeroen Jan Stoutjesdijk, Visserstraat 16, NL-1401 Sx Bussum; Theodorus Michael De Rooij, Alfred Nobellaan 100, NL-3731 DX DE Bilt; Cornelis Marinus Kooijman, Jan Van Scorelhage 28, NL-3437, KD Nieuwegein, all of (NL)

( * ) Notice: Subject to any disclaimer, the term of this patent is extended or adjusted under 35 U.S.C. 154(b) by 0 days.

(21) Appl. No.: 09/728,612

(22) Filed: Nov. 29, 2000

Related U.S. Application Data

(63) Continuation-in-part of application No. 09/397,811, filed on Sep. 17, 1999, now abandoned.

(51) Int. Cl.[7] ................................................ F27D 7/06
(52) U.S. Cl. ........................................................ 432/2
(58) Field of Search ............................ 432/2, 5, 6, 239, 432/241, 242, 245; 414/935, 941; 219/209, 390

(56) References Cited

U.S. PATENT DOCUMENTS

| 4,179,530 A | 12/1979 | Köppl et al. |
| 4,620,508 A | 11/1986 | Fligner et al. |
| 4,725,204 A | 2/1988 | Powell |
| 4,753,192 A | 6/1988 | Goldsmith et al. |
| 5,308,955 A | 5/1994 | Watanabe |
| 5,421,892 A | 6/1995 | Miyagi |
| 5,507,639 A | 4/1996 | Monoe |
| 5,525,057 A | 6/1996 | Monoe |
| 5,556,275 A | 9/1996 | Sakata et al. |
| 5,616,264 A | 4/1997 | Nishi et al. |
| 5,769,628 A | 6/1998 | Lin |

FOREIGN PATENT DOCUMENTS

| WO | WO 98/46345 | 10/1998 |
| WO | WO 98/50606 | 11/1998 |

*Primary Examiner*—Gregory Wilson
(74) *Attorney, Agent, or Firm*—Knobbe, Martens, Olson & Bear, LLP

(57) ABSTRACT

Method for purging a furnace comprising a closable processing tube defining in its interior a closable, processing space, a purging gas being flowed along the outer surface of the processing tube separated from the processing gas flow inside the processing tube, wherein said processing gas flow comprises a gas being reactive with air at elevated temperature and said purging gas comprises an inert gas. A furnace assembly for realizing this method is proposed comprising a controller for controlling force connected in a conduit connected to a source of reactive and inert gas respectively. This controller is realized such that only after placing the closure of the processing chamber in the closing position the valve in the supply conduit for reactive gas can be opened and said closure can only be removed from said closing position after said valve in supply conduits for reactive gas has been closed.

16 Claims, 3 Drawing Sheets

METHOD FOR PURGING A FURNACE AND FURNACE ASSEMBLY

This application is a continuation-in-part of Ser. No. 09/397,811, filed Sep. 17, 1999, now abandoned.

BACKGROUND OF THE INVENTION

The invention relates to the operation of a furnace for the treatment of objects (substrates) such as wafers with a reactive gas. Such a reactive gas can comprise hydrogen or another gas that, if it comes into contact with air, can form an explosive mixture.

In the prior art this problem is avoided by providing an additional tube surrounding the process tube hermetically and purging the gap between the process tube and the outer tube with an inert gas. However, in case an event results in heavy damage of the process tube, and consequently, in escape of reactive gas from the process tube, it is likely that the same event results also in heavy damage of the outer tube because both tubes are closely connected together and both tubes are made of refractory materials like quartz or silicon carbide which are susceptible to breakage upon mechanical impact. Such an event can be an earthquake which are regular phenomena is some of the worlds most important semiconductor manufacturing areas. Also it is possible that, because of the close connection of the tubes, breakage of one tube induces breakage of the other tube.

SHORT DESCRIPTION OF THE INVENTION

It is an object of the invention to provide a method for the treatment of an object in a furnace, wherein it is possible to use a high concentration of reactive gas without the risk of an explosion.

It is a further object of the present invention to provide a furnace in combination with conduits (system) with which the treatment of a substrate with a reactive gas in a comparatively high concentration is possible.

Is a further object of the present invention to carry out such a treatment at a comparatively high temperature.

According to a further object of the present invention it is intended, after the treatment at a comparatively high temperature, to comparatively quickly and uniformly realize cooling of the process space and thus of the substrate.

According to an aspect of the invention, a method is provided for purging a furnace comprising a closable processing tube defining in its interior a closable processing space, a purging gas being flowed along the outer surface of the processing tube separated from the processing gas flow inside the processing tube, wherein said processing gas flow comprises a gas being reactive with air at elevated temperature and said purging gas comprises at least 90 vol. % of an inert gas.

According to a further aspect of the invention, the purging gas comprises at least 99% by volume of an inert gas. Nitrogen can be used as the inert gas. Furthermore the purging gas can comprise at least 100 ppm by volume of an oxidizing gas and preferably at least 0.1% by volume of an oxidizing gas. According to a preferred embodiment of the invention, the reactive gas comprises at least 6% by volume of hydrogen.

The oxidizing gas can comprise oxide, $H_2O$, $CO_2$ or $N_2O$ alone or in any combination. Preferably oxygen or air (compressed) is used.

The pressure in the furnace or other treatment room is preferably atmospheric. According to a further aspect of the invention, the purging gas is not only used for purging the furnace as well as the space around it, but the purging gas also acts as a cooling medium.

Optimal safety is achieved if the treatment space is also purged, this purging preferably taking place after the treatment has finished, but before the treatment room is brought into contact with the environment.

If the purging gas is used for cooling, according to a special embodiment of the invention, the direction of movement of this gas is periodically reversed so that an even cooling occurs from the inlet to the outlet.

According to a further aspect, the invention relates to a method for treating a substrate in a furnace at elevated temperature with a processing gas, said processing gas being reactive with air at processing temperature of said substrate, wherein after said substrate is introduced in said furnace, the processing chamber thereof is purged with an inert gas before reactive processing gas is introduced in said processing chamber.

Moreover, the invention relates to a furnace assembly comprising a furnace having a processing chamber surrounded by heating means, said processing chamber having a removable closure, at least a gas inflow and gas outflow opening, said gas inflow opening being connected to at least two supply conduits each comprising a controller controlled valve and connected to a source of reactive and inert gas respectively, a controller for controlling said valves such that only after placing said closure in the closing position in said processing chamber the valve in the supply conduit for reactive gas can be opened and said closure can only be removed from said closing position after said valve in supply conduits for reactive gas has been closed.

Preferably the space through which the purge gas is conducted is defined by the heating element and/or the isolation thereof.

Moreover, safety measures are present. These are implemented such that the continuous purging during a certain period of time is guaranteed before the reactive gas is brought into the treatment space (while it is closed) or before the treatment space is brought into contact with the environment. Likewise (constant) checks are made on the purging gasses for the presence of oxygen to detect any leaks in the system.

According to a further aspect of the invention there are various valves for the supply of process gas and inert respectively purging gas, implemented such that when the energy supply fails, the supply of the inert/purging gas is still guaranteed.

DETAILED DESCRIPTION OF THE INVENTION

The invention will be explained below with reference to two embodiments, schematically shown in the attached drawing, wherein the advantages and particular qualities of the invention are elucidated, and wherein.

Figure 1:
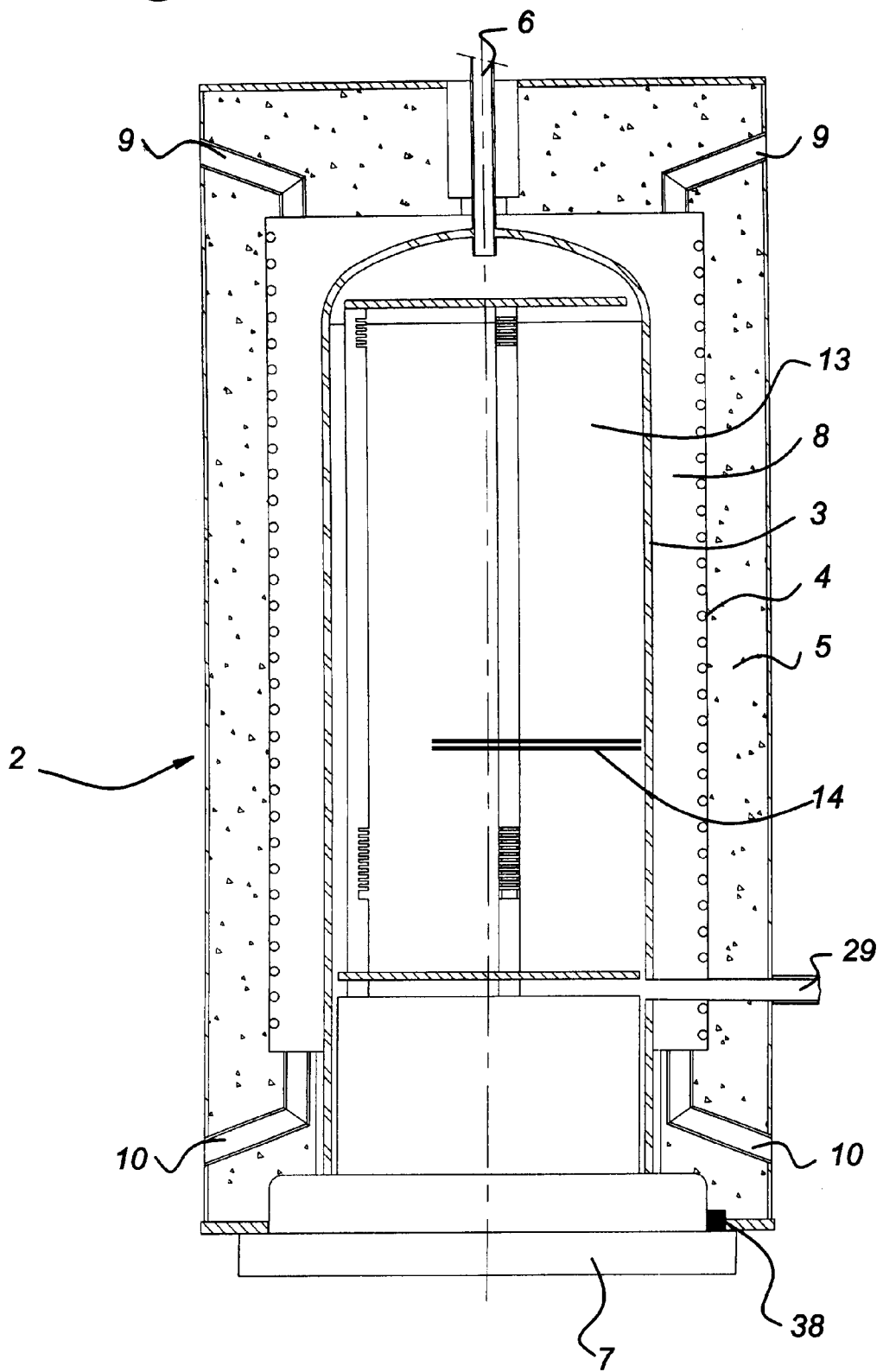
FIG. 1 shows a schematic drawing of a furnace.
Figure 2:
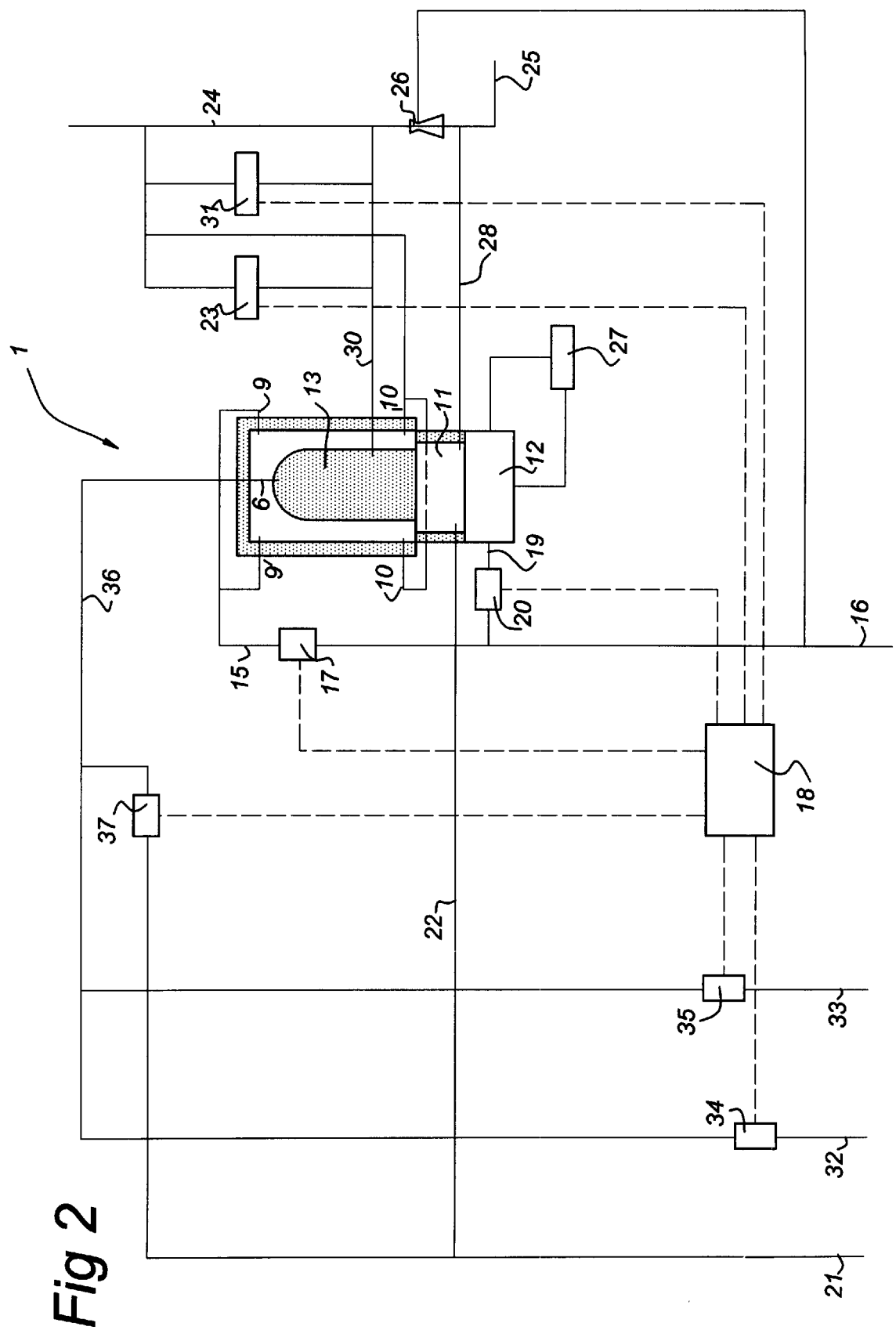
FIG. 2 shows a first embodiment of the system according to the invention as a schematic diagram.

In FIG. 2, a first embodiment of the system according to the invention is indicated as a whole by 1. This consists of a furnace 2, of which details are shown in FIG. 1. Furnace 2 is built up of processing tube 3, which preferably consists of quartz or silicon carbide material. In the processing tube a boat 13 is schematically shown, filled with wafers 14. The furnace is heated with heating elements 4, around which a thermal insulation 5 is fitted. Processing tube 3 is provided with an inflow opening 6 and an outflow opening 29. The processing tube is open on the underside and can be closed off by the door plate 7 from the sluice space and carousel space which are situated under the furnace. The space between processing tube 3 and the heating elements 4 and insulation 5, respectively, is indicated by 8. This is provided with inlets 9 and outlets 10. A sluice space 11 is situated under the furnace 2, under which, for example, a carousel space 12 can be fitted. As an extra precaution, to prevent process gas from getting into the carousel space 12, the sluice space 11 is purged with nitrogen during the execution of process.

The aim is to carry out a process within processing tube 3, wherein a reactive gas such as hydrogen is used. This gas is used in such a quantity, that, at the elevated temperature at which this reaction is carried out, the possible presence of oxygen (air) leads to a real danger of explosion.

To prevent such risks wherever possible, a number of measures are taken. According to the invention it is proposed, that as long as the above described real danger of explosion exists, space 8 be purged with nitrogen. To that end, the inlets 9 are connected to a conduit 15, which in turn is connected to a source of nitrogen 16. A valve 17 is present in conduit 15. This is connected to controller 18. Source 16 is also connected to carousel space 12 via conduit 19. Dosing is controlled by a valve 20, which is connected to controller 18. The sluice space 11 can also be provided with nitrogen. This has a higher purity, however, and the corresponding nitrogen source is indicated by 21 and the supply conduit 22.

At the outer circumference, space 8 is delimited by the heating elements. When, with a view to the safety, space 8 is purged with a pure inert gas like nitrogen, the lifetime of the heating element will be severely affected. This is caused by the fact that by exposure of the metal heating wire of the heating elements to air at elevated temperatures a film of metal oxide is formed on the wire surface. This metal oxide appears to be very essential for the mechanical stability of the heating wire and serves as a protective film against evaporation of the metal wire at high temperature. During temperature cycling of the furnace, cracks can form in the protective metal oxide film, locally exposing the metal surface and leading to localized aging of the wire. Therefore, continuous presence of a minimum concentration of oxidizing gas in space 8 during high temperature operation of the furnace is essential to ensure a long life time of the heating element. A minimum concentration of 100 ppm by volume, and more preferably 0.1% by volume is required to maintain the metal oxide film in good condition. This minimum concentration of oxidizing gas can be achieved by providing the heating element, which forms the enclosing shell of space 8, by an amount of leaks that, on the one hand, allows a sufficient amount of indiffusion of air and, on the other hand, allows to maintain a gas atmosphere in space 8 that is predominantly composed of inert gas. As an alternative, a small flow of air can be mixed with the large nitrogen flow that is fed into space 8 in order to achieve the required low concentration of oxidizing gas. For this purpose, a conduit 55 is connected to inlets 9, which conduit 55 is connected to a source of compressed air 56. A valve 57 is present in conduit 55 which valve is connected to controller 18.

Controller 18 consists of a combination of hardware and software. In general, the aim according to invention is to implement in hardware as many as possible of the controls that are important for the security of the system. In this way, the effect of problems in the software can be avoided, as far as possible. It should be understood that, depending on the development of the software and the inherent security thereof, some parts can be implemented in software. In the controller 18, at least one timer is present for controlling the time period during which purging is carried out, in the method described below.

The outlets 10 are connected to the outlet 24 of the system. Connected onto here in parallel are an oxygen analysing apparatus 23 to detect the presence of oxygen in parallel with a special analysing apparatus 43 for analysing the presence of the reactive process gas. Each analyser is connected to controller 18.

The outlet 24 is connected to a central extraction system, not shown in FIG. 2 and not belonging to the system as such. The operational safety is increased by providing the drain 24 with dilution by nitrogen gas and with an extra pump action and further dilution by air through the nitrogen, originating from source 16, to be introduced by means of an inlet 26 working using the venturi principle. Air is let in via conduit 25 and is discharged to conduit 24. The drain of outlet 10 connects onto conduit 24 directly upstream of venturi-inlet 26.

A further oxygen analysing apparatus is indicated by 27. An amount of gas is continuously pumped around in the carousel space 12 by means of a pump, not shown in the drawing.

The outlet of sluice space 11 is indicated by 28. This also ends up in the discharge conduit 24. When the furnace is working, the spaces around the processing tube are purged with nitrogen. This relates to both the purging of space 8 and the sluice space 11 and carousel space 12. Clearly, for the purging of space 8, a comparatively small amount of gas will be used, which does not or barely influences the warming of processing tube 13. With the help of the above described oxygen analysing apparatus, the presence of oxygen in the various spaces is continuously checked. The outflow opening of processing tube 13 is indicated by 29 (FIG. 1) and ends up in the conduit 30. This conduit 30 leads on one side to conduit 24, while part of the gas flowing through there is branched off to oxygen analysing apparatus 31 connected to controller 18.

A source of argon is indicated by 32, and 33 indicates a source of treatment gas such as hydrogen. Valves 34, 35 are present to regulate the flow of the argon and nitrogen. The outlets of these valves are connected by the conduit 36, which is connected to the inlet 6 of the processing tube.

A door switch is indicated by 38 which passes on to controller 18 whether or not the door plate 7 is open. If one or more wafers in processing tube 13 have to be treated with a reactive gas, such as one originating from source 33, a boat 13 with wafers 14 is introduced under an inert atmosphere. Such an inert atmosphere can be obtained when valve 34 is open and valve 35 is closed. Purging with nitrogen is possible by operating valve 37.

After the introduction of the objects to be treated and closing of the door plate 7, a signal is sent via door switch 38 to controller 18. Consequently a timing cycle is started. Purging of the space around the processing tube with nitrogen takes place. During a minimum purging time of 10 minutes with a minimum flow of nitrogen of 5 slm (Standard liters per minute) it is not possible to open the valve 35 of the reactive process gas. Only after the minimal purging requirements are met is the valve 35 again released for use.

After completion of the purging cycle, valve 34 is closed and valve 35 is opened by controller 18.

Consequently, the process can take place in processing tube 3. Gas originating from the outflow opening 29 of the processing tube is continuously discharged to outlet 24. By the introduction of nitrogen via the venturi-inlet and the air carried along by the venturi-action, any unused hydrogen present is diluted to such an extent that there is no longer an explosive mixture. The presence of oxygen is continuously monitored with the help of an analysis apparatus 31. Should any irregularities arise, then the supply of gas from source 33 is immediately stopped and valve 34 is opened. It has been implemented such that, at the loss of flow, a similar situation occurs.

After the process with hydrogen is completed, by the continual purging of the space around the processing tube 3 with nitrogen, which took place during the whole treatment, the supply of hydrogen is blocked by closing valve 35. Then either argon is let into the processing tube, or extremely pure nitrogen.

During a minimum purging time of 10 minutes with a minimum stream of argon or nitrogen of 5 slm (Standard liters per minute), it is not possible to open door plate 7. Only after the minimum purging requirements are met can the door plate 7 be opened again.

For the quick cooling of the processing tube it is possible to move an increased amount of nitrogen from inlet 9 to outlet 10. This absorbs the heat of the objects situated in processing tube.

With the apparatus described above it is guaranteed that during the stage in which the reactive gas such as hydrogen is introduced, an atmosphere of nitrogen is continuously present around the treatment space, while likewise the presence of oxygen in the various drains is checked. Moreover, the process can only be started up after a certain period of purging with inert gas has taken place and the same holds for the removal of the wafers from the processing tube.

Figure 3:
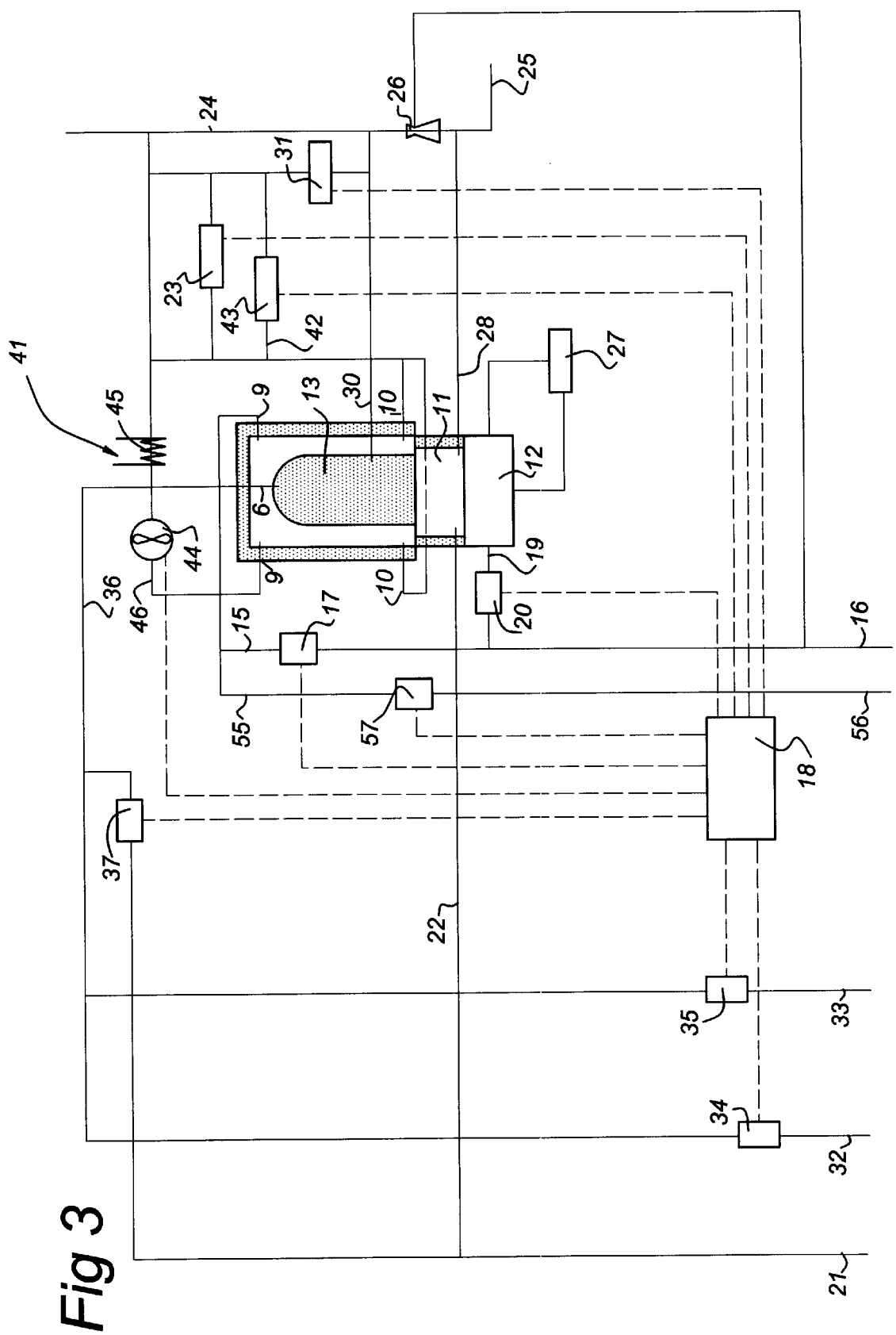
FIG. 3 a shows second embodiment of the system according to invention, whereby the furnace is provided with quick cooling.

In FIG. 3 a variant of the apparatus of FIG. 2 is shown, wherein the furnace is used according to FIG. 1.

The most important difference is that a particular system is included to be able to cool the processing tube quicker after the reaction with the reactive gas.

The parts corresponding to the embodiment shown in FIG. 2 are provided with the same reference numbers. The whole system shown in FIG. 3 is indicated by 41. Space 8 in the shown embodiment is filled with an inert gas originating from source 16 via conduit 15 controlled by valve 17. However, in contrast to the embodiment described above, no continuous complete discharge of the gas takes place. Only a small amount of the gas is discharged via conduit 42.

A special analysing apparatus 43 for detecting the presence of reactive process gas is fitted in conduit 42 and connected to controller 18. In parallel to special analysing apparatus 43, an oxygen analysing apparatus, connected to controller 18, is provided.

In this embodiment, the inlets 9 and the outlets 10 are connected to each other via conduit 46, in which a pump 44 is fitted. A heat exchanger 45 is also fitted. This can be a gas—gas heat exchanger, which is connected on the other side to the ambient air. This can also be a gas-liquid heat exchanger. Working of pump 4 is regulated by controller 18.

With the system 41 according to FIG. 3, in principle, the same working is possible as in system 1 that is described above. However, for the quick and even cooling of the processing tube 3, gas in space 8 is moved at increased speed from inlet 9 to outlet 10 by the effects of pump 44, whereby the heat exchanger 45 removes the absorbed heat. An even cooling is achieved by the periodic reversing of the direction of movement of the gas by means of a valve system (not shown). For details of the method of working reference is made to WO 98/00151.

Also for this embodiment it is essential that during the process, processing tube 3 is continuously enclosed in a "shell" of a gas that is inert with respect to the reactive gas which is applied in the processing tube 3.

While the invention above is described with reference to a preferred embodiment, for the persons skilled in the art it is clear that numerous changes are possible which are clear after reading the description above and are within the scope of the attached claims.

What is claimed is:

1. A method of purging a furnace comprising:
   providing a closable processing tube defining in an interior a closable processing space, a purging gas being flowed through a space enclosing the processing tube and being delimited by an inner circumference of heating elements and isolation material; and
   providing a flow of said purging gas separated from a flow of processing gas inside the processing tube, wherein said flow of the processing gas comprises a gas reactive with air at elevated temperature, wherein said purging gas comprises at least 90% by volume of an inert gas, and wherein said reactive gas comprises at least 6% by volume $H_2$.

2. A method of purging a furnace comprising:
   providing a closable processing tube defining in an interior a closable processing space, a purging gas being flowed through a space enclosing the processing tube and being delimited by an inner circumference of heating elements and isolation material;
   providing a flow of said purging gas separated from a flow of processing gas inside the processing tube, wherein said flow of the processing gas comprises a gas reactive with air at elevated temperature, and wherein said purging gas comprises at least 90% by volume of an inert gas; and
   after processing, purging the interior of the processing tube with a purging gas, wherein only after said purging the processing tube is openable, and wherein said purging is effected during at least 10 minutes.

3. A method of purging a furnace comprising:
   providing a closable processing tube defining in an interior a closable processing space, a purging gas being flowed through a space enclosing the processing tube and being delimited by an inner circumference of heating elements and isolation material; and
   providing a flow of said purging gas separated from a flow of processing gas inside the processing tube, wherein said flow of the processing gas comprises a gas reactive with air at elevated temperature, wherein said purging gas comprises at least 90% by volume of an inert gas and serves as a cooling gas, and wherein said purging is effected with a flow of at least 5 slm inert gas.

4. A method of purging a furnace comprising:
   providing a closable processing tube defining in an interior a closable processing space, a purging gas being flowed through a space enclosing the processing tube and being delimited by an inner circumference of heating elements and isolation material;
   providing a flow of said purging gas separated from a flow of processing gas inside the processing tube, wherein said flow of the processing gas comprises a gas reactive with air at elevated temperature, wherein said purging gas comprises at least 90% by volume of an inert gas and serves as a cooling gas; and periodically reversing the direction of the cooling gas during purging.

5. A method of purging a furnace comprising:

providing a closable processing tube defining in an interior a closable processing space, a purging gas being flowed through a space enclosing the processing tube and being delimited by an inner circumference of heating elements and isolation material;

providing a flow of said purging gas separated from a flow of processing gas inside the processing tube, wherein said flow of the processing gas comprises a gas reactive with air at elevated temperature, wherein said purging gas comprises at least 90% by volume of an inert gas and serves as a cooling gas; and guiding the cooling gas along an essentially closed circuit in which cooling gas is cooled through a liquid-gas heat exchanger.

6. A method for treating a substrate in a furnace at elevated temperature, comprising:

providing a furnace having a closable processing tube defining in an interior a closable processing space, a purging gas being flowed through a space enclosing the processing tube and being delimited by an inner circumference of heating elements and isolation material;

providing a flow of said purging gas separated from a flow of processing gas inside the processing tube, wherein said flow of the processing gas comprises a gas reactive with air at a processing temperature of said substrate, and wherein said purging gas comprises at least 90% by volume of an inert gas; and after said substrate is introduced in said furnace, purging the processing tube with the inert gas before reactive processing gas can be introduced in said processing tube, wherein said purging is effected during at least ten minutes.

7. A method for treating a substrate in a furnace at elevated temperature, comprising:

providing a furnace having a closable processing tube defining in an interior a closable processing space, a purging gas being flowed through a space enclosing the processing tube and being delimited by an inner circumference of heating elements and isolation material;

providing a flow of said purging gas separated from a flow of processing gas inside the processing tube, wherein said flow of the processing gas comprises a gas reactive with air at a processing temperature of said substrate, and wherein said purging gas comprises at least 90% by volume of an inert gas; and after said substrate is introduced in said furnace, purging the processing tube with the inert gas before reactive processing gas can be introduced in said processing tube, wherein said purging is effected with a flow of at least 5 slm inert gas.

8. A method of treating a substrate in a furnace at elevated temperature, comprising:

providing a furnace having a closable processing tube defining in an interior a closable processing space, a purging gas being flowed through a space enclosing the processing tube and being delimited by an inner circumference of heating elements and isolation materials;

providing a flow of said purging gas separated from a flow of processing gas inside the processing tube, wherein said flow of the processing gas comprises a gas reactive with air at a processing temperature of said substrate, and wherein said purging gas comprises at least 90% by volume of an inert gas; and after said substrate is introduced in said furnace, purging the processing tube with the inert gas before reactive processing gas can be introduced in said processing tube, wherein said reactive gas comprises at least 6% by volume $H_2$.

9. Furnace assembly comprising a furnace having a processing chamber being surrounded by at least a further chamber being provided with at least a gas inlet connected to a source of purging gas said source comprising at least 90 vol. % inert gas, and a gas outlet and surrounded by heating means, said processing chamber having a removable closure, at least a gas inflow and gas outflow opening, said gas inflow opening being connected to at least two supply conduits each comprising a controller controlled valve and connected to a source of reactive and inert gas respectively, a controller for controlling said valves such that only after placing said closure in the closing position in said processing chamber the valve in the supply conduit for reactive gas can be opened and said closure can only be removed from said closing position after said valve in supply conduits for reactive gas has been closed.

10. Furnace assembly according to claim 9, wherein said further chamber is provided with to supply at least 100 ppm of an oxidizing gas.

11. Furnace assembly according to claim 10, wherein said means comprise a source of compressed air.

12. Furnace assembly according to claim 9, wherein said controller is arranged to control said valves such that only after opening the valve in the supply conduit for inert gas during a predetermined term said closure can be opened.

13. Furnace assembly according to claim 9 comprising a timer which is connected to said closure and/or to one of said valves.

14. Furnace assembly according to claim 9 wherein said gas outlet is provided with an oxygen sensor, connected to said controller.

15. Furnace assembly according to claim 9 wherein said further chamber comprises a loading space.

16. Furnace assembly according to claim 9 wherein the outflow opening for gas is connected to a venturi based discharge pump.

* * * * *